(12) United States Patent
Lin

(10) Patent No.: US 11,528,024 B2
(45) Date of Patent: Dec. 13, 2022

(54) LEVEL ADJUSTING CIRCUIT AND GATE DRIVING DEVICE INCLUDING THE SAME

(71) Applicant: DEVICE DYNAMICS LAB CO., LTD., Hsinchu County (TW)

(72) Inventor: Ming-Cheng Lin, Zhubei (TW)

(73) Assignee: Device Dynamics Lab Co., Ltd., Zhubei (TW)

( * ) Notice: Subject to any disclaimer, the term of this patent is extended or adjusted under 35 U.S.C. 154(b) by 0 days.

(21) Appl. No.: 17/509,605

(22) Filed: Oct. 25, 2021

(65) Prior Publication Data

US 2022/0224328 A1    Jul. 14, 2022

(30) Foreign Application Priority Data

Jan. 12, 2021    (TW) .................................. 110101136

(51) Int. Cl.
| | |
|---|---|
| *H03K 3/00* | (2006.01) |
| *H03K 17/16* | (2006.01) |
| *H03K 17/687* | (2006.01) |
| *H02M 1/08* | (2006.01) |
| *H03K 17/12* | (2006.01) |

(52) U.S. Cl.
CPC ......... *H03K 17/687* (2013.01); *H03K 17/122* (2013.01)

(58) Field of Classification Search
None
See application file for complete search history.

(56) References Cited

U.S. PATENT DOCUMENTS

| | | | | |
|---|---|---|---|---|
| 3,809,998 | A * | 5/1974 | Mansson | H02M 3/04 327/332 |
| 4,831,280 | A * | 5/1989 | Caya | H03K 17/6872 327/179 |
| 5,686,820 | A * | 11/1997 | Riggio, Jr. | G05F 1/575 323/280 |
| 8,395,422 | B2 * | 3/2013 | Ogawa | H03K 17/063 327/109 |
| 8,558,587 | B2 * | 10/2013 | Machida | H02M 1/08 327/427 |
| 9,755,639 | B2 * | 9/2017 | Kampl | H03K 17/74 |
| 10,263,538 | B2 * | 4/2019 | Ikeda | H02M 7/537 |
| 10,432,081 | B2 * | 10/2019 | Hirose | H02M 3/33592 |
| 10,826,484 | B2 * | 11/2020 | Hu | H03K 17/04106 |
| 11,165,421 | B1 * | 11/2021 | Nosaka | H02M 1/08 |
| 2014/0375362 | A1 | 12/2014 | Lobsiger et al. | |
| 2018/0013413 | A1 | 1/2018 | Chuang | |

OTHER PUBLICATIONS

Search Report appended to an Office Action, which was issued to Taiwanese counterpart application No. 110101136 by the TIPO dated Aug. 3, 2021, with an English translation thereof.

* cited by examiner

*Primary Examiner* — Kenneth B Wells
(74) *Attorney, Agent, or Firm* — Michael Best & Friedrich LLP

(57) ABSTRACT

A level adjusting circuit includes a parallel resistor-capacitor (RC) sub-circuit, a first diode and an adjustable voltage supply. The RC sub-circuit includes an input capacitor and an input resistor, and includes an input node electrically connected to a driving signal source for receiving a driving signal therefrom, and an output node that outputs an adjusted driving signal. The first diode and the adjustable voltage supply are electrically connected, and are further electrically connected to the output node and a reference voltage node, respectively.

8 Claims, 5 Drawing Sheets

LEVEL ADJUSTING CIRCUIT AND GATE DRIVING DEVICE INCLUDING THE SAME

CROSS-REFERENCE TO RELATED APPLICATION

This application claims priority of Taiwanese Patent Application No. 110101136, filed on Jan. 12, 2021.

FIELD

The disclosure relates to a level adjusting circuit and a driving device, and more particularly to a level adjusting circuit for adjusting a driving signal from a gate driver, and a gate driving device including the level adjusting circuit.

BACKGROUND

Wide-bandgap semiconductor (also known as the third generation semiconductor) materials include silicon carbide (SiC) and gallium nitride (GaN). The third generation semiconductor materials have favorable characteristics such as relatively high carrier mobility and a relatively large bandgap. For example, a semiconductor device manufactured using GaN material (also known as GaN devices) may have a figure of merit (FOM) that is 5 to 10 times higher than that of a semiconductor device manufactured using silicon material. As a result, the third generation semiconductor materials may be employed to manufacture devices for more advanced applications such as high-voltage power devices and high-frequency communication devices.

While GaN devices have passed the reliability standard issued by JEDEC Solid State Technology Association, since the performances of third generation semiconductor material devices under different conditions (such as a static condition, a dynamic condition, etc.) may vary, it is still desirable to establish an on-site testing mechanism for determining a number of qualities of GaN devices, such as robustness in applications and system-level reliability.

FIG. 1 is a circuit diagram illustrating a conventional gate driving device used for testing, for example, a power device. The gate driving device includes a commercially available gate driver 11 that receives an input signal (Vin) and outputs an output signal (Vout). The output signal (Vout) is provided to a gate of a to-be-tested device 19 (such as a field-effect transistor) for switching a mode of operation of the to-be-tested device 19 in order to test and determine the performance of the to-be-tested device 19.

In this configuration, the range of voltage that can be outputted by the gate driving device is between a power supply voltage (Vcc) and a reference voltage (Vss, typically the voltage of ground).

SUMMARY

One object of the disclosure is to provide a level adjusting circuit that can adjust voltage of a driving signal outputted by a commercially available gate driver.

According to one embodiment of the disclosure, the level adjusting circuit includes:

a parallel resistor-capacitor (RC) sub-circuit that includes an input capacitor and an input resistor that are connected in parallel, the parallel RC sub-circuit including an input node electrically connected to a driving signal source for receiving a driving signal therefrom, and an output node that outputs an adjusted driving signal; and a first diode and an adjustable voltage supply that are electrically connected, the first diode being further electrically connected to the output node, and the adjustable voltage supply being further electrically connected to a reference voltage node.

Another object of the disclosure is to provide a gate driving device that includes the above-mentioned level adjusting circuit.

According to one embodiment of the disclosure, the gate driving device includes:

a gate driver circuit that is configured to receive a supply voltage, and that is connected to a reference voltage node, the gate driver circuit including an input port that receives an input voltage signal and an output port that outputs a driving signal;

a parallel resistor-capacitor (RC) sub-circuit that includes an input capacitor and an input resistor (45) that are connected in parallel, the parallel resistor-capacitor sub-circuit including an input node electrically connected to the output port of the gate driver circuit for receiving the driving signal (Vout) therefrom, and an output node that outputs an adjusted driving signal to a to-be-supplied component;

a first diode and an adjustable voltage supply that are electrically connected, the first diode being further electrically connected to the output node, and said adjustable voltage supply being further electrically connected to the reference voltage node.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
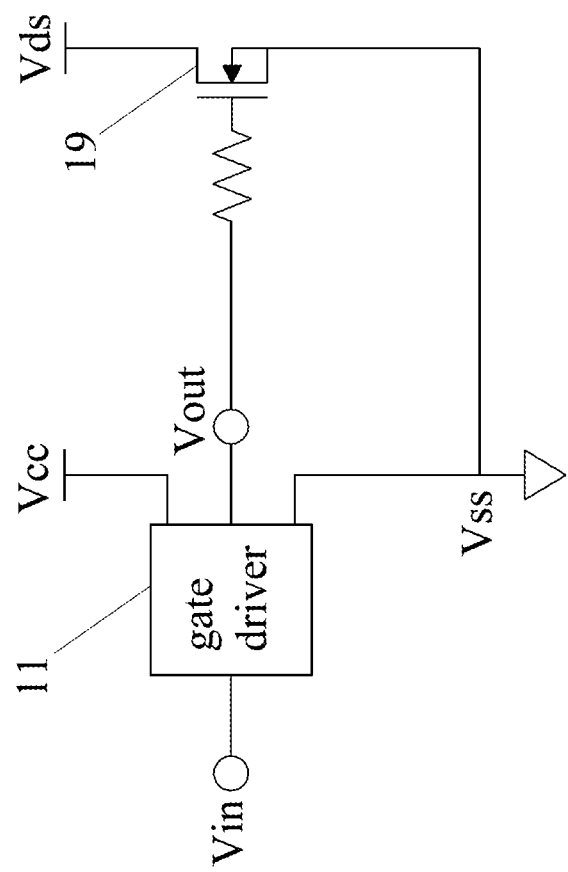
FIG. 1 is a circuit diagram illustrating a conventional gate driving device used for testing.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
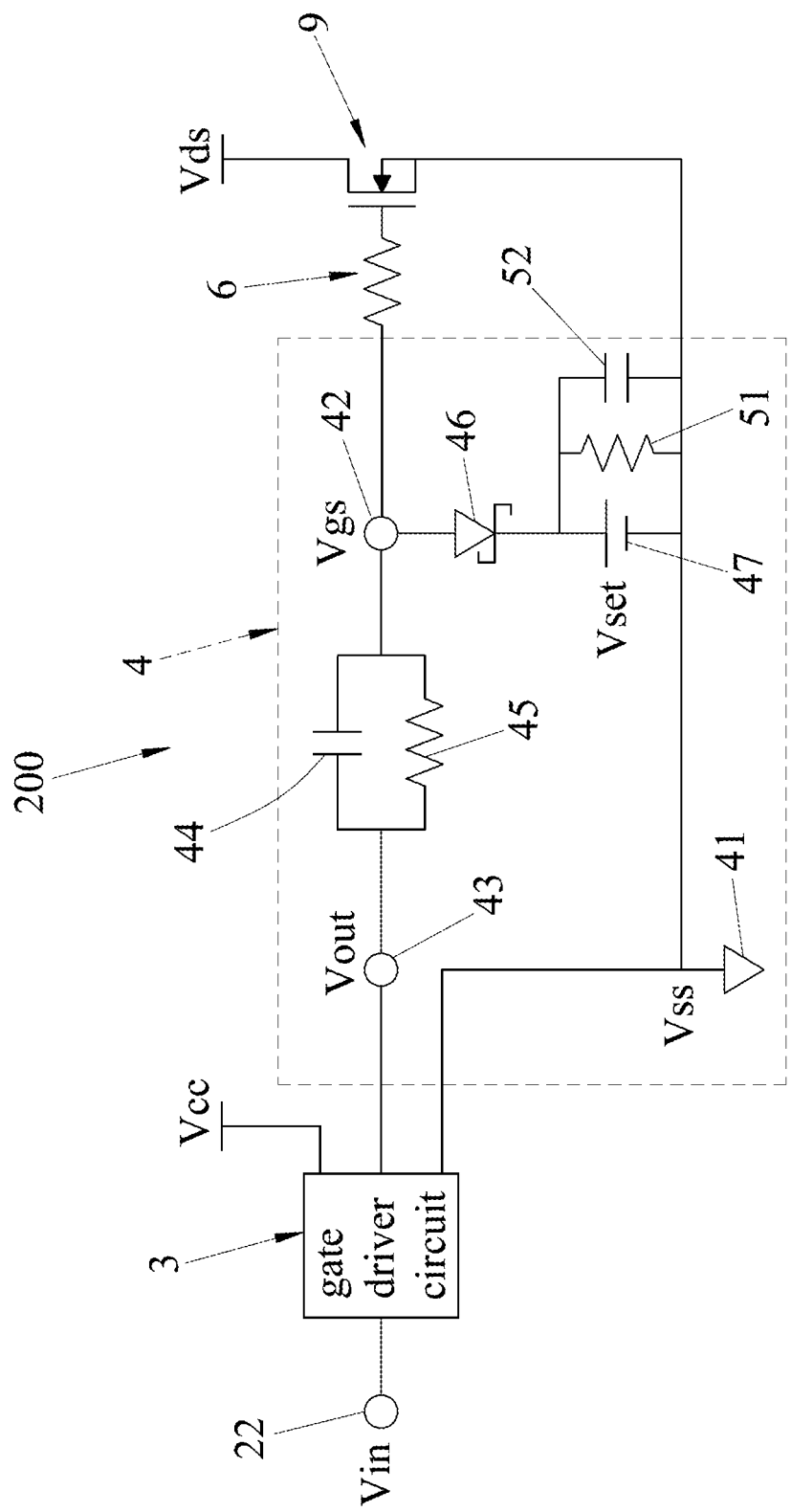
FIG. 2 is a circuit diagram illustrating a gate driving device according to one embodiment of the disclosure.

FIG. 2 is a circuit diagram illustrating a gate driving device 200 according to one embodiment of the disclosure. In this embodiment, the gate driving device 200 includes a gate driver circuit 3, a level adjusting circuit 4, and a slew rate adjusting resistor 6.

The gate driver circuit 3 may be embodied using a commercially available gate driver (which may be in the form of a discrete integrated circuit), is configured to receive a supply voltage (Vcc), and is connected to a reference voltage node 41. The reference voltage node 41 has a reference voltage (Vss) which may be a ground voltage (Gnd).

The gate driver circuit 3 includes an input port 22 that receives an input voltage signal (Vin) and an output port that outputs a driving signal (Vout). In this embodiment, the input voltage signal (Vin) may be in the form of a rectangular pulse wave signal generated by, for example, a control circuit (not shown), and the driving signal (Vout) is an amplified version of the input voltage signal (Vin) with no phase difference with respect to the input voltage signal (Vin). That is, the driving signal (Vout) and the input voltage signal (Vin) are said to be in phase.

The level adjusting circuit 4 includes a parallel resistor-capacitor (RC) sub-circuit that includes an input capacitor 44 and an input resistor 45 that are connected in parallel, a first diode 46, and an adjustable voltage supply 47.

The parallel RC sub-circuit includes an input node 43 electrically connected to a driving signal source (i.e., the gate driver circuit 3) for receiving the driving signal (Vout) therefrom, and an output node 42 that outputs an adjusted driving signal (Vgs). It is noted that the input capacitor 44 serves as a signal path for the driving signal (Vout) when the driving signal (Vout) is in a transient state, and the input resistor 45 serves as a signal path for the driving signal (Vout) when the driving signal (Vout) is in a steady state.

The first diode 46 and the adjustable voltage supply 47 are electrically connected, the first diode 46 is further electrically connected to the output node 42, and the adjustable voltage supply 47 is further electrically connected to the reference voltage node 41. In this embodiment, the first diode 46 is embodied using a Schottky diode that is known to have a low forward voltage drop and a high switching speed, and the adjustable voltage supply 47 may be embodied using a commercially available power supply that provides an adjustable voltage (Vset).

In this embodiment, the first diode 46 includes an anode that is electrically connected to the output node 42, and a cathode. The adjustable voltage supply 47 includes a positive terminal that is electrically connected to the cathode of the first diode 46, and a negative terminal that is electrically connected to the reference voltage node 41.

The adjustable voltage supply 47 may be embodied using a four quadrant power supply that can provide positive or negative voltage, and that can source or sink electrical current.

In some embodiments, the level adjusting circuit 4 further includes a resistor 51 that is connected in parallel with the adjustable voltage supply 47. The resistor 51 may act as a current path for an electrical current flowing through the first diode 46—when the voltage supply 47 is not operating at the 4$^{th}$ quadrant mode (i.e., providing a positive voltage and sinking current). That is to say, the electrical current flowing through the first diode 46 may go into the resistor 51 path, under specified voltage and current settings from the adjustable voltage supply 47.

In some embodiments, the level adjusting circuit 4 further includes a capacitor 52 that is connected in parallel with the adjustable voltage supply 47. The capacitor 52 may act to reduce an adverse effect resulting from a sudden change of voltage across the adjustable voltage supply 47.

The slew rate adjusting resistor 6 includes one end connected to the output node 42 and another end connected to a to-be-supplied component 9. In this embodiment, the to-be-supplied component 9 is an N-channel field effect transistor, and may be other semiconductor devices, circuitry or system that are intended to be tested by applying a signal thereto. Said another end of the slew rate adjusting resistor 6 is connected to a gate of the to-be-supplied component 9. It is noted that a resistance of the slew rate adjusting resistor 6 may be adjusted so that a slew rate associated with the to-be-supplied component 9 (and therefore, a switching speed) may also be adjusted to accommodate different conditions.

Figure 3:
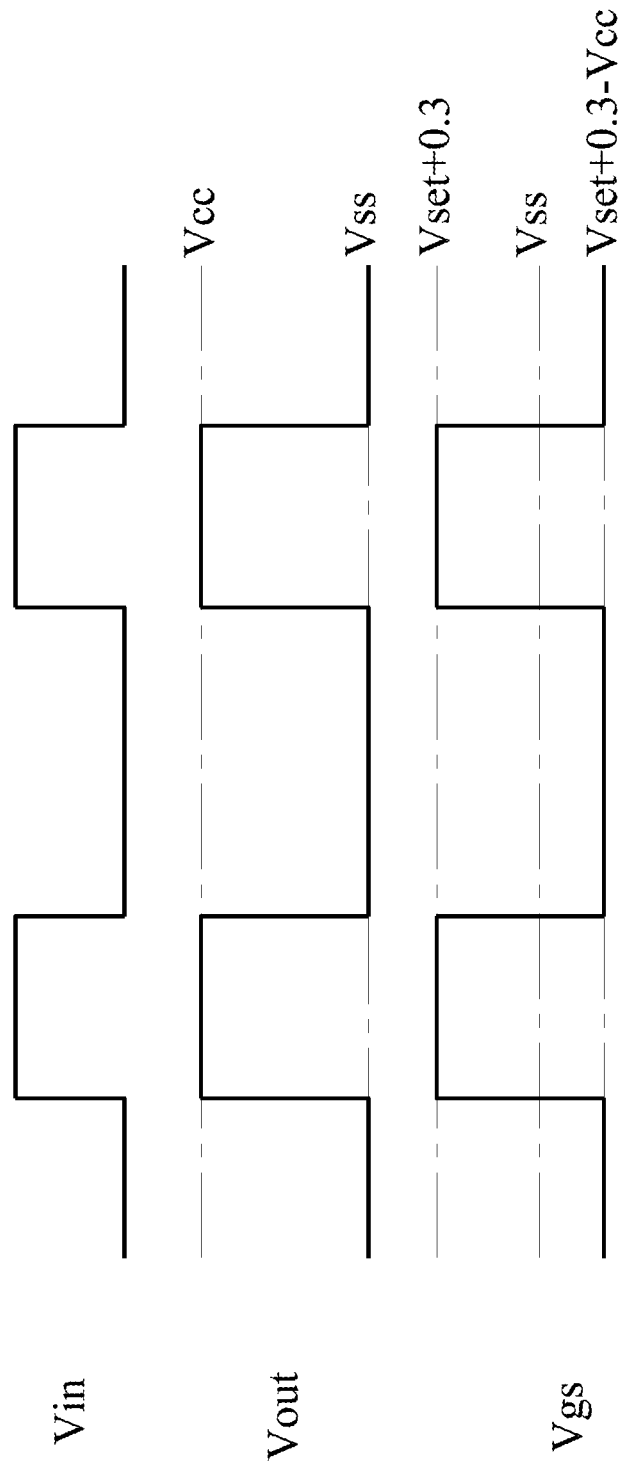
FIG. 3 is a signal diagram illustrating relationships among an input voltage signal, a driving signal and an adjusted driving signal outputted by a level adjusting circuit of the gate driving device of FIG. 2.

FIG. 3 is a signal diagram illustrating relationships among the input voltage signal (Vin), the driving signal (Vout) and the adjusted driving signal (Vgs) outputted by the level adjusting circuit 4 of the gate driving device 200 of FIG. 2. It is noted that the input voltage signal (Vin) and the driving signal (Vout) are rectangular pulse waves and are in phase, and the input voltage signal (Vin) varies between a low level and a high level.

In the case that the input voltage signal (Vin) is at the low level, the corresponding driving signal (Vout) is also at a low level that is close to the reference voltage (Vss), and therefore the first diode 46 experiences reverse bias. As such, the resulting voltage of the adjusted driving signal (Vgs) may be expressed as Vset+0.3−Vcc (volts), where 0.3 is a forward voltage drop of the first diode 46.

On the other hand, in the case that the input voltage signal (Vin) is at the high level, the corresponding driving signal (Vout) is also at a high level that is close to the supply voltage (Vcc), and therefore the first diode 46 experiences a forward bias. As such, the resulting voltage of the adjusted driving signal (Vgs) may be expressed as Vset+0.3 (volts), where 0.3 is the forward voltage drop of the first diode 46. In this case, an electrical current from the cathode of the first diode 46 and an electrical current from the positive terminal of the adjustable voltage supply 47 both flow to the reference voltage node 41 through the resistor 51.

It is noted that the level adjusting circuit 4 of the gate driving device 200 of FIG. 2 is capable of providing an adjusted driving signal (Vgs) with two different voltage levels that are different from the supply voltage (Vcc) and the reference voltage (Vss) and that can be adjusted by altering the adjustable voltage (Vset) supplied by the adjustable voltage supply 47.

Figure 4:
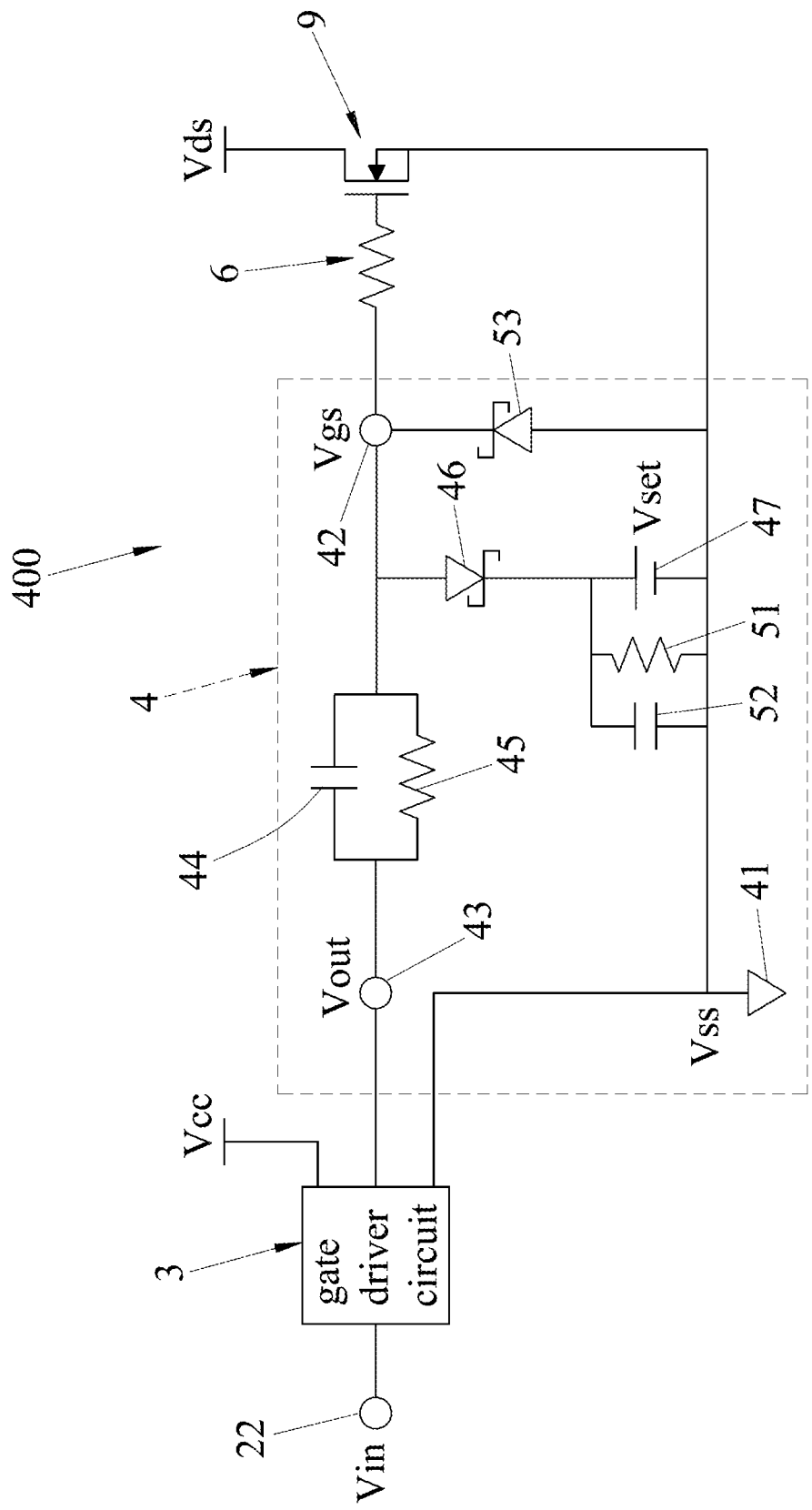
FIG. 4 is a circuit diagram illustrating a gate driving device according to one embodiment of the disclosure.

FIG. 4 is a circuit diagram illustrating a gate driving device 400 according to one embodiment of the disclosure.

In this embodiment, aside from the components of the gate driving device 200 of FIG. 2, the gate driving device 400 further includes a second diode 53. The second diode 53 includes an anode that is electrically connected to the reference voltage node 41, and a cathode that is electrically connected to the output node 42. In this embodiment, the second diode 53 is embodied using a Schottky diode that is known to have a low forward voltage drop and a high switching speed.

Figure 5:
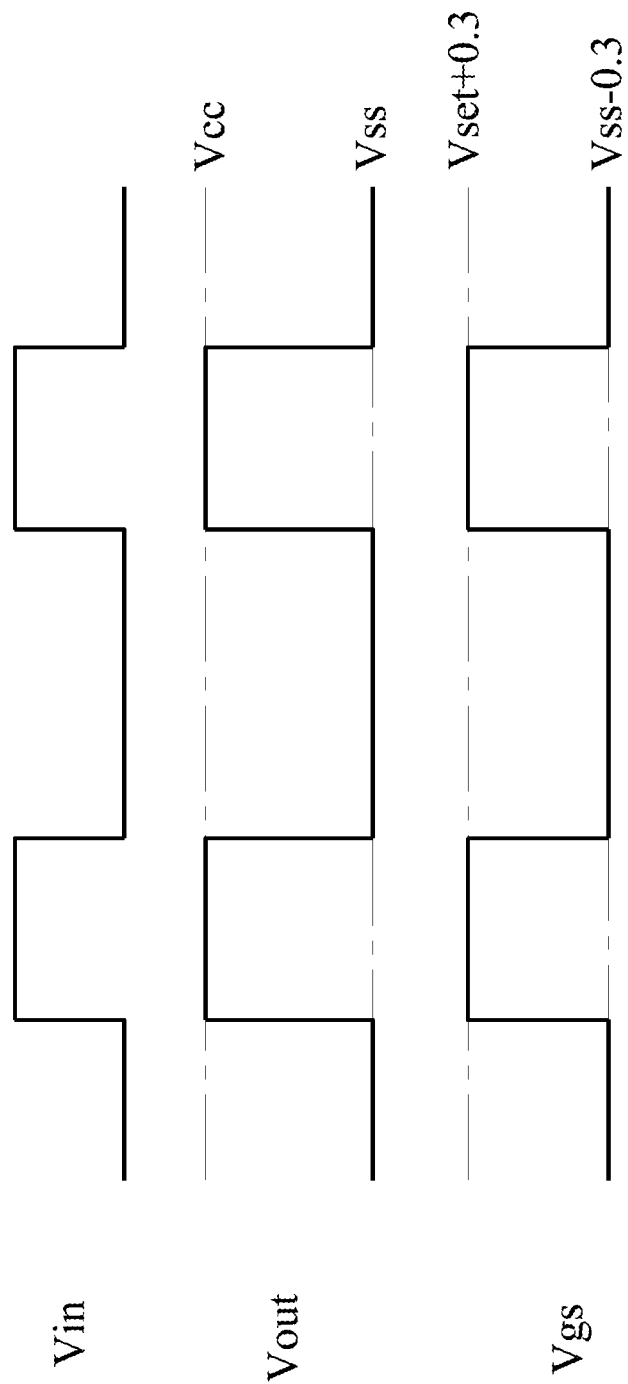
FIG. 5 is a signal diagram illustrating relationships among an input voltage signal, a driving signal and an adjusted driving signal outputted by a level adjusting circuit of the gate driving device of FIG. 4.

FIG. 5 is a signal diagram illustrating relationships among the input voltage signal (Vin), the driving signal (Vout) and the adjusted driving signal (Vgs) outputted by the level adjusting circuit 4 of the gate driving device 400 of FIG. 4. It is noted that the input voltage signal (Vin) and the driving signal (Vout) are rectangular pulse waves and are in phase, and the input voltage signal (Vin) varies between a low level and a high level.

In the case that the input voltage signal (Vin) is at the low level, the corresponding driving signal (Vout) is also at a low level that is close to the reference voltage (Vss), and therefore the first diode 46 experiences reverse bias, and the second diode 53 experiences forward bias. Once the voltage across the input capacitor 44 drops to an extent that the second diode 53 is no longer forward-biased, the voltage of the adjusted driving signal (Vgs) is clamped by the second diode 53. As such, the resulting voltage of the adjusted driving signal (Vgs) may be expressed as Vss−0.3 (volts), where 0.3 is a forward voltage drop of the second diode 53.

On the other hand, in the case that the input voltage signal (Vin) is at the high level, the corresponding driving signal (Vout) is also at a high level that is close to the supply voltage (Vcc), and therefore the first diode 46 experiences forward bias, and the second diode 53 experiences reverse bias. As such, the resulting voltage of the adjusted driving signal (Vgs) may be expressed as Vset+0.3 (volts), where 0.3 is the forward voltage drop of the first diode 46. In this case, an electrical current from the cathode of the first diode 46 and an electrical current from the positive terminal of the adjustable voltage supply 47 both flow to the reference voltage node 41 through the resistor 51.

It is noted that the level adjusting circuit 4 of the gate driving device 400 of FIG. 4 is capable of providing an adjusted driving signal (Vgs) with two different voltage levels that are different from the supply voltage (Vcc) and the reference voltage (Vss). One of the two different voltage levels can be adjusted by altering the adjustable voltage (Vset) supplied by the adjustable voltage supply 47.

One effect of the embodiments of the disclosure is that, by configuring the level adjusting circuit of the gate driving device to output the adjusted driving signal (Vgs), where the voltage level(s) of the adjusted driving signal (Vgs) can be adjusted, the gate driving device may be used in a wide range of applications that require input signals of various voltage levels. For example, when a number of devices from different manufacturers are to be tested for comparing performance among the devices (an operation known as benchmarking), the operation may be done by using the same gate driving device and adjusting the voltage level (s) of the adjusted driving signal (Vgs) when necessary. In some cases where a driving level effect (e.g., a transient speed or on-state performances that depend on a driving level) for some devices, circuitry or systems may be optimized by adjusting the adjusted driving signal (Vgs) to specific voltage levels, the gate driving device described in the disclosure may be particularly useful.

According to one embodiment of the disclosure, there is provided a level adjusting circuit that is configured to be connected between a driving signal source (e.g., a gate driver circuit) and a to-be-supplied component.

The level adjusting circuit includes a parallel resistor-capacitor (RC) sub-circuit, a first diode and an adjustable voltage supply.

The RC sub-circuit includes an input capacitor and an input resistor that are connected in parallel. The parallel RC sub-circuit includes an input node electrically connected to the driving signal source for receiving a driving signal therefrom, and an output node that outputs an adjusted driving signal.

The first diode and the adjustable voltage supply are electrically connected, the first diode is further electrically connected to the output node, and the adjustable voltage supply is further electrically connected to a reference voltage node.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A level adjusting circuit comprising:
    a parallel resistor-capacitor (RC) sub-circuit that includes an input capacitor and an input resistor that are connected in parallel, said parallel RC sub-circuit including an input node electrically connected to a driving signal source for receiving a driving signal therefrom, and an output node that outputs an adjusted driving signal;
    a first diode and an adjustable voltage supply that are electrically connected, said first diode being further electrically connected to the output node, and said adjustable voltage supply being further electrically connected to a reference voltage node; and
    a second diode which includes an anode that is electrically connected to the reference voltage node, and a cathode that is electrically connected to the output node.

2. The level adjusting circuit of claim 1, wherein:
    said first diode includes an anode that is electrically connected to the output node, and a cathode; and
    said adjustable voltage supply includes a positive terminal that is electrically connected to the cathode of said first diode, and a negative terminal that is electrically connected to the reference voltage node.

3. The level adjusting circuit of claim 2, further comprising a resistor that is connected in parallel with said adjustable voltage supply.

4. The level adjusting circuit of claim 2, further comprising a capacitor that is connected in parallel with said adjustable voltage supply.

5. A gate driving device comprising:
    a gate driver circuit that is configured to receive a supply voltage (Vcc), and that is connected to a reference voltage node, said gate driver circuit including an input port that receives an input voltage signal (Vin) and an output port that outputs a driving signal (Vout);
    a parallel resistor-capacitor (RC) sub-circuit that includes an input capacitor and an input resistor that are connected in parallel, said parallel resistor-capacitor sub-circuit including an input node electrically connected to said output port of said gate driver circuit for receiving the driving signal (Vout) therefrom, and an output node that outputs an adjusted driving signal (Vgs) to a to-be-supplied component;
    a first diode and an adjustable voltage supply that are electrically connected, said first diode being further electrically connected to the output node, and said adjustable voltage supply being further electrically connected to the reference voltage node; and a second diode which includes an anode that is electrically connected to the reference voltage node, and a cathode that is electrically connected to the output node.

6. The gate driving device of claim 5, further comprising a resistor that is connected in parallel with said adjustable voltage supply.

7. The gate driving device of claim 5, further comprising a capacitor that is connected in parallel with said adjustable voltage supply.

8. The gate driving device of claim 5, the to-be-supplied component being a transistor, the gate driving device further comprising a resistor electrically connected between the output node and a gate of the transistor.

\* \* \* \* \*